(12) United States Patent
Morinaga et al.

(10) Patent No.: US 7,166,909 B2
(45) Date of Patent: Jan. 23, 2007

(54) METHOD AND APPARATUS FOR MOLDING MODULE ELECTRONIC DEVICES AND A MODULE ELECTRONIC DEVICE MOLDED THEREBY

(75) Inventors: Shoji Morinaga, Oita (JP); Mitsuru Adachi, Kanagawa (JP); Yuji Himeno, Oita (JP)

(73) Assignee: Sony Corporation, Tokyo (JP)

( * ) Notice: Subject to any disclaimer, the term of this patent is extended or adjusted under 35 U.S.C. 154(b) by 30 days.

(21) Appl. No.: 11/031,388

(22) Filed: Jan. 8, 2005

(65) Prior Publication Data
US 2005/0116332 A1   Jun. 2, 2005

Related U.S. Application Data

(62) Division of application No. 10/381,993, filed on Jul. 7, 2003, now Pat. No. 6,940,159.

(51) Int. Cl.
*H01L 23/22* (2006.01)
*H01L 23/24* (2006.01)
(52) U.S. Cl. ..................... 257/687; 257/787
(58) Field of Classification Search ............ 257/687, 257/787
See application file for complete search history.

(56) References Cited

U.S. PATENT DOCUMENTS 6,376,921 B1 * 4/2002 Yoneda et al. ............. 257/787
6,392,294 B1 * 5/2002 Yamaguchi ................. 257/690

* cited by examiner

*Primary Examiner*—Phat X. Cao
(74) *Attorney, Agent, or Firm*—Sonnenschein Nath & Rosenthal LLP

(57) ABSTRACT

In a method for molding module electronic devices, an outer edge portion (24a') of each of plural terminals (24) arranged on a base board (23) is subjected to press-deformation processing by a curved portion (30R) of an upper mold (30) to be shaped into a curved outer end portion (24a) when the upper mold (30) is caused to be in contact with a lower mold (31) for forming a molding space between the upper and lower molds (30;31) in which the base board (23) is positioned, then the molding space is filled with dissolved resin under a condition in which the curved portion (30R) of the upper mold (30) is in tight contact with the curved outer end portion (24a) of each of plural terminals (24), and finally the upper and lower molds (30;31) are separated from each other after the dissolved resin (36) in the molding space has solidified so that a module electronic device provided with the base board (23) on which the plural terminals (24) each having the curved outer end portion (24a) and a resin-molded portion (21;22) which covers the base board (23) with the terminals (24) exposed to the outside is obtained.

2 Claims, 6 Drawing Sheets

METHOD AND APPARATUS FOR MOLDING MODULE ELECTRONIC DEVICES AND A MODULE ELECTRONIC DEVICE MOLDED THEREBY

RELATED APPLICATION DATA

The present application is a divisional of U.S. application Ser. No. 10/381,993, filed Jul. 7, 2003, U.S. Pat. No. 6,940,159, of which is incorporated herein by reference to the extent permitted by law.

BACKGROUND OF THE INVENTION

The invention claimed in each of the claims of the present application relates to a method for molding module electronic devices each capable of being easily coupled with and removed from a connector provided on an electronic apparatus to be used for, for example, an information recording medium in which data are stored and from which the data are read, an apparatus for molding on which the method is carried out or a module electronic device molded by the method.

There has been already spread several module electronic devices, each of which is capable of being easily coupled with and removed from a connector provided on an electronic apparatus, such as a personal computer, an information recording and reproducing apparatus or the like, to be used for, for example, an information recording medium of the card type which operates under the condition of electrical connection with the electronic apparatus. One type of the previously proposed module electronic devices is so constituted as to shown in FIGS. 1 and 2, for example.

Referring to FIGS. 1 and 2, one example of the previous module electronic devices is shown to be a module electronic device 1. The module electronic device 1 has a base board 3 and upper and lower covers 15 and 17 each made of resin. The base board 3 is put between the upper and lower covers 15 and 17. Several circuit elements 14 are mounted on the base board 3 and further plural terminals 2 and plural isolating ribs 5 are fixed to be arranged on the base board 3.

In the module electronic device 1, the upper and lower covers 15 and 17 are adhered to each other to be combined with the base board 3. The plural terminals 2 are so arranged in the direction of width of the base board 3 that an end face 2a of each of the terminals 2 is identical in position with an end face 3a of the base board 3. A part of the base board 3 on which the plural terminals 2 are provided is exposed to the outside of the upper cover 15. The lower cover 17 extends over the end face 2a of each of the terminals 2 and the end face 3a of the base board 3 to form a fringe portion 17a of the lower cover 17 positioned at the outside of the end faces 2a and 3a.

When the module electronic device 1 having the upper and lower covers 15 and 17 as described above is produced, it is necessary such relatively troublesome works as to combine, with the greatest care, the upper and lower covers 15 and 17 with the basic board 3 on which the circuit elements 14 are mounted and the terminals 2 and ribs 5 are arranged and to adhere the upper and lower covers 15 and 17 to each other. These works for combining the upper and lower covers 15 and 17 with the basic board 3 and adhering the upper and lower covers 15 and 17 to each other prevent the module electronic device 1 from being miniaturized and therefore it is feared that the module electronic device 1 can not be sufficiently small-sized.

Accordingly, in order to avoid the disadvantages mentioned above, it is considered to obtain the module electronic device 1, which is capable of being coupled with and removed from the connector provided on the electronic apparatus, as a resin-molding which is produced by means of a molding machine having a pair of upper and lower molds 6 and 7 as shown in FIG. 3.

In FIG. 3, the upper and lower molds 6 and 7 which are put in a mutually contacting condition are shown and a base board 3' on which several circuit elements (not shown) are mounted and plural terminals and plural ribs (not shown) are arranged in the same manner as the base board 3 shown in FIG. 1 is put in a molding space between the upper and lower molds 6 and 7. The molding space between the upper and lower molds 6 and 7 is formed to have its shape identical substantially with the external shape of the module electronic device 1.

Under the condition in which the base board 3' is put in the molding space with terminals 2' (only one of the terminals 2' is shown in FIG. 3) facing the upper mold 6, dissolved resin 8 is injected with high pressure into the molding space between the upper and lower molds 6 and 7 from a resin injecting portion (not shown in the figures) provided at the outside of the upper and lower molds 6 and 7 so that the molding space is filled with the dissolved resin 8. The dissolved resin 8 injected into the molding space covers the base board 3' with the terminals 2' on the base board 3' exposed to the outside of the dissolved resin 8. Then, when the dissolved resin 8 injected into the molding space has been cooled and solidified, the upper and lower molds 6 and 7 are removed from each other, so that a module electronic device is obtained as a resin-molding from the molding machine which is provided with the upper and lower molds 6 and 7.

The module electronic device thus obtained as the resin-molding has upper and lower parts corresponding respectively to the upper and lower covers 15 and 17 of the module electronic device 1 shown in FIG. 1 though it is formed in a body with the solidified resin. The lower part of the module electronic device is provided with a fringe portion which is similar to the fringe portion 17a of the lower cover 17 of the module electronic device 1 shown in FIG. 1. Further, in the module electronic device obtained from the molding machine having the upper and lower molds 6 and 7, the end face 2a' of each of the terminals 2' and the end face 3a' of the base board 3' are in contact with the fringe portion of the lower part in the similar manner as those in the module electronic device 1 shown in FIG. 1.

It is possible to mold two or more of the above mentioned module electronic device at a time by means of plural pairs of upper and lower molds and therefore the production cost of module electronic device can be reduced.

When the module electronic device is produced by means of the molding machine having the upper and lower molds 6 and 7 as mentioned above, it is desired that the upper and lower molds 6 and 7 forming the molding space and the base board 3' as a molding raw material are in high processing accuracy so that the module electronic device is molded into a predetermined shape with high accuracy and the plural terminals 2' are fixed in position of arrangement on the base board 3' of the module electronic device.

However, the processing accuracy of each of the upper and lower molds 6 and 7 and the base board 3' has its limit as a matter of course and each of the upper and lower molds 6 and 7 and the base board 3' has a predetermined dimensional tolerance. In the case where a resin-molding process is carried out under the condition in which there is a positional difference within the dimensional tolerance between each of the upper and lower molds 6 and 7 and the base board 3', it is feared that the module electronic device obtained as the resin-molding is undesirably provided with an unnecessary resin wall 11 formed on or in close vicinity of the terminals 2' as shown in FIG. 4 or FIG. 5.

In the case of the unnecessary resin wall 11 shown in FIG. 4, when the dissolved resin 8 injected into the molding space formed between the upper and lower molds 6 and 7 solidifies to form upper and lower parts 9 and 10 of the module electronic device in a body, the dissolved resin 8 spreads to the terminals 2' on the base board 3' through a very small gap between the upper mold 6 and the terminals 2' and solidifies thereon to form the unnecessary resin wall 11 extending from a fringe portion 10a of the lower part 10 over the terminals 2'. In the case of the unnecessary resin wall 11 shown in FIG. 5, when the dissolved resin 8 injected into the molding space formed between the upper and lower molds 6 and 7 solidifies to form upper and lower parts 9 and 10 of the module electronic device in a body, the dissolved resin 8 rises to be higher than the terminals 2' in close vicinity of the terminals 2' and solidifies thereat to form the fringe portion 10a of the lower part 10 to be higher than the terminals 2' so that a top of the fringe portion 10a forms the unnecessary resin wall 11.

The unnecessary resin wall 11 as shown in FIG. 4 or FIG. 5, especially, the unnecessary resin wall 11 as shown in FIG. 5, is unavoidably formed even in the condition in which the processing accuracy of each of the upper and lower molds 6 and 7 and the base board 3' is improved to be respectably high.

When the module electronic device with the unnecessary resin wall 11 as shown in FIG. 4 or FIG. 5 is coupled with or removed from a connector 19 provided on an electronic apparatus, contacts 19a of the connector 19 come into contact with the unnecessary resin wall 11 to slide over the same and thereby the surface of the unnecessary resin wall 11 is shaved off by the contacts 19a to produce a resin powder P, as shown in FIG. 6. The resin powder P thus produced is put on the terminals 2' and likely to injure a layer of surface treatment provided on each of the contacts 19a and the terminals 2' and come to be put between the contacts 19a and terminals 2' for preventing the contacts 19a from being in electrical contact with the terminals 2'. When the contacts 19a are prevented by the resin powder P from being in electrical contact with the terminals 2', the module electronic device having the base board 3' on which the terminals 2' are arranged is not correctly connected with the electronic apparatus having the connector 19.

Accordingly, it is an object of the invention claimed in each of the claims of the present invention to provide a method for molding module electronic devices each capable of being easily coupled with and removed from a connector provided on an electronic apparatus to be used for an information recording medium of the card type or the like, with which the module electronic device can be obtained as a resin-molding without an unnecessary resin wall which is formed on or in close vicinity of terminals thereof and likely to prevent the module electronic device from being correctly coupled with the electronic apparatus, an apparatus for molding on which the method is carried out and a module electronic device molded by the method.

SUMMARY OF THE INVENTION

According to the invention claimed in any of claims 1 to 3 of the present application, there is provided a method for molding module electronic devices which comprises a step of causing upper and lower molds to be separated from each other, said upper and lower molds being caused selectively to be in contact with each other for forming a molding space between the upper and lower molds and to be separated from each other, and putting a base board, on which a circuit element is mounted and plural terminals are arranged, between the upper and lower molds separated from each other, a step of causing the upper and lower molds to be in contact with each other in such a manner that the upper mold comes into contact with the plural terminals to cover the same and the base board is positioned in the molding space, a step of injecting dissolved resin into the molding space to fill the same with the dissolved resin, and a step of separating the upper and lower molds from each other after the dissolved resin injected into the molding space has solidified so that a module electronic device having a resin-molded portion which covers the base board with the terminals on the base board exposed to the outside is obtained, characterized in that an outer edge portion of each of the plural terminals on the base board is subjected to press-deformation processing by the upper mold in the step of causing the upper and lower molds to be in contact with each other.

Especially, in the method according to the invention claimed in claim 2 of the present application, the upper mold is provided with a portion shaped to have a curved inner surface or a slant inner surface for coming into contact with the plural terminals to cover the same and the outer edge portion of each of the plural terminals on the base board is subjected to press-deformation processing by the portion of the upper mold shaped to have the curved inner surface or the slant inner surface in the step of causing the upper and lower molds to be in contact with each other.

According to the invention claimed in any of claims 4 to 7 of the present application, there is provided an apparatus for molding module electronic devices which comprises a lower mold on which a base board on which a circuit element is mounted and plural terminals are arranged is put, an upper mold operative selectively to separate from the lower mold and to be in contact with the lower mold so as to come into contact with the plural terminals on the base board put on the lower mold to cover the same and forming a molding space between the upper and lower molds, and a resin injecting portion for injecting dissolved resin into the molding space to fill the same with the dissolved resin, characterized in that an outer edge portion of each of the plural terminals on the base board is subjected to press-deformation processing by the upper mold when the upper mold comes into contact with the lower mold on which the base board is put.

Especially, in the apparatus according to the invention claimed in claim 5 of the present application, the upper mold is provided with a portion shaped to have a curved inner surface or a slant inner surface for coming into contact with the plural terminals on the base board to cover the same and an outer edge portion of each of the plural terminals is subjected to press-deformation processing by the portion of the upper mold shaped to have the curved inner surface or the slant inner surface when the upper mold comes into contact with the lower mold on which the base board is put.

According to the invention claimed in claim 8 or claim 9, there is provided a module electronic device which comprises a base board on which a circuit element is mounted and plural terminals are arranged, and a resin-molded portion which covers the base board with the terminals on the base board exposed to the outside, characterized in that each of the terminals on the base board has a curved outer end portion or a slant outer end portion formed by press-deformation processing.

Especially, in the module electronic device according to the invention claimed in claim 9 of the present application, the base board has a projecting end portion extending to the outside beyond an outer end portion of each of the plural terminals arranged on the base board.

In the method according to the invention claimed in any of claims 1 to 3 of the present application or the apparatus according to the invention claimed in any of claims 4 to 7 of the present application, the base board is positioned in the molding space when the upper and lower molds come into contact with each other. On that occasion, the outer edge portion of each of the plural terminals on the base board is subjected to the press-deformation processing by the portion of the upper mold which is shaped to have, for example, the curved inner surface or the slant inner surface. This means that the portion of the upper mold comes into tight contact with an outer end portion of each of the plural terminals.

Therefore, the upper mold having the portion which comes into tight contact with the outer end portion of each of the plural terminals does not form any gap between the upper mold and the outer end portion of each of the terminals into which the dissolved resin injected into the molding space comes to form an unnecessary resin wall on or in close vicinity of the terminals.

Consequently, in the module electronic device obtained with the method according to the invention claimed in any of claims 1 to 3 of the present application or the apparatus according to the invention claimed in any of claims 4 to 7 of the present application, each of the plural terminals arranged on the base board to be exposed to the outside has its deformed outer end portion in the form of, for example, the curved outer end portion or the slant outer end portion formed by the press-deformation processing by the upper mold without any unnecessary resin wall.

Further, the module electronic device according to the invention claimed in claim 8 or claim 9 of the present application is obtained with the apparatus according to the invention claimed in any of claims 4 to 7 of the present application in which the method according to the invention claimed in any of claims 1 to 3 of the present application is carried out, and therefore, in the module electronic device according to the invention claimed in claim 8 or claim 9 of the present application, each of the plural terminals arranged on the base board to be exposed to the outside has its deformed outer end portion in the form of, for example, the curved outer end portion or the slant outer end portion formed by the press-deformation processing by the upper mold without any unnecessary resin wall.

DETAILED DESCRIPTION OF THE PRESENTLY PREFERRED EMBODIMENTS

Figure 7:
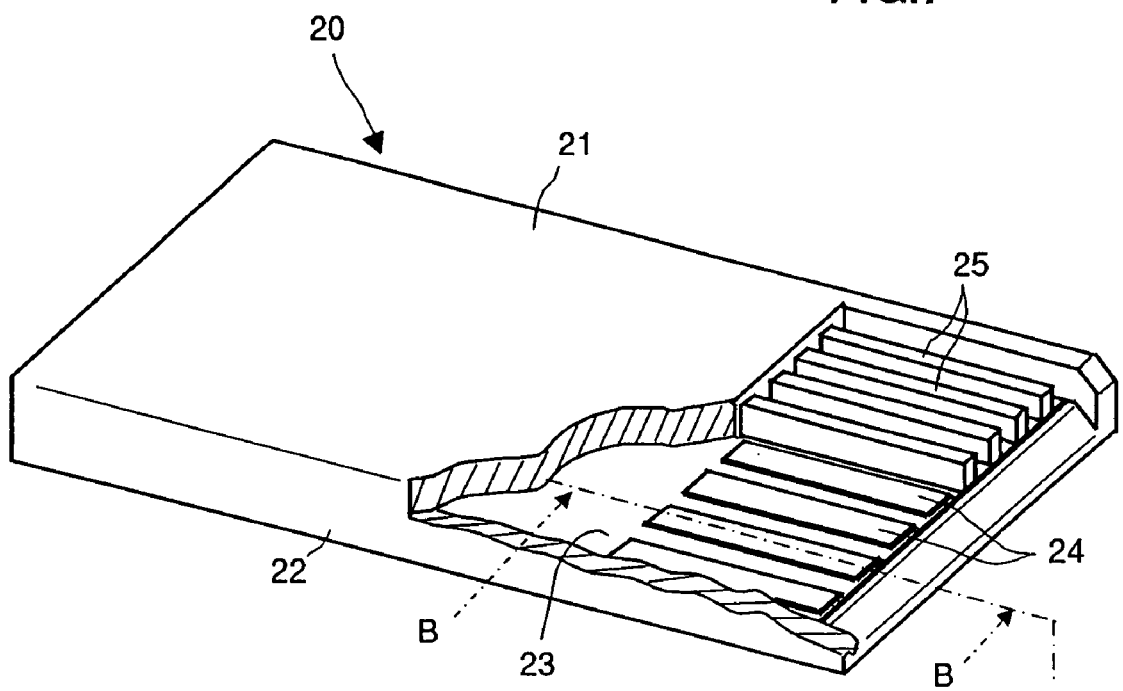
FIG. 7 is a partially broken perspective view showing an example of a module electronic device according to the invention claimed in claim 8 or claim 9 of the present application obtained with an example of an apparatus for molding module electronic devices according to the invention claimed in any of claims 4 to 7 of the present application in which an example of a method for molding module electronic devices according to the invention claimed in any of claims 1 to 3 of the present application is carried out.

FIG. 7 shows an embodiment of module electronic device according to the invention claimed in claim 8 or claim 9 of the present application. The embodiment is shown in the form of a module electronic device 20. The module electronic device 20 is obtained as a resin-molding which is capable of being easily coupled with and removed from a connector provided on an electronic apparatus such as a personal computer to be used for, for example, an information recording medium of the card type.

Figure 1:
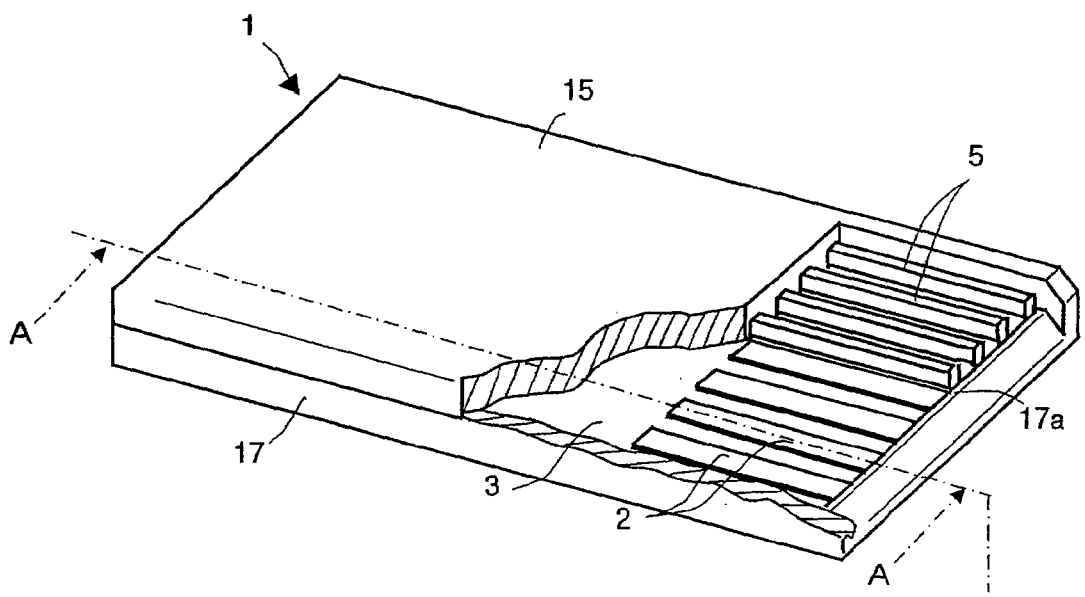
FIG. 1 is a partially broken perspective view showing a previously proposed module electronic device.
Figure 2:
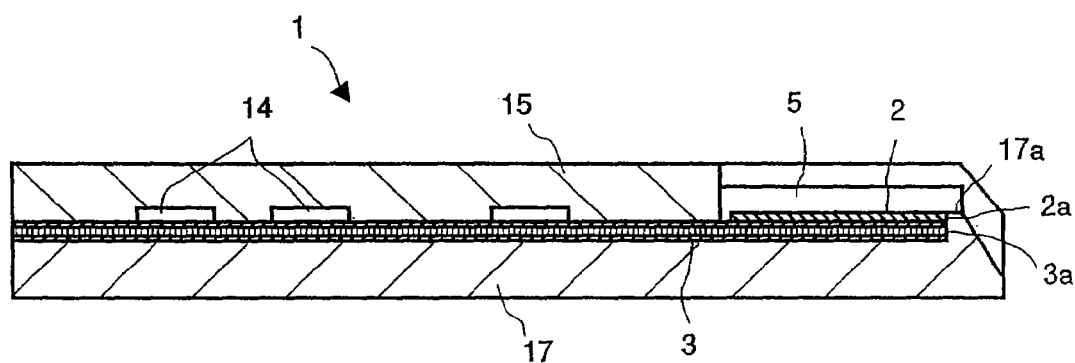
FIG. 2 is a cross-sectional view along a line A—A in FIG. 1.
Figure 3:
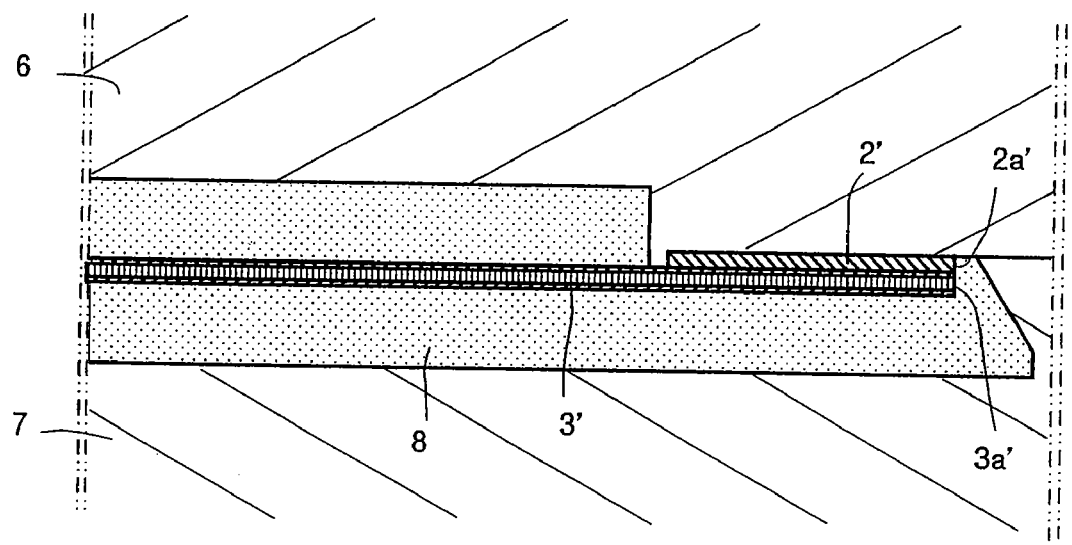
FIG. 3 is an enlarged cross-sectional view used for explanation of resin molding for a previously proposed module electronic device.
Figure 4:
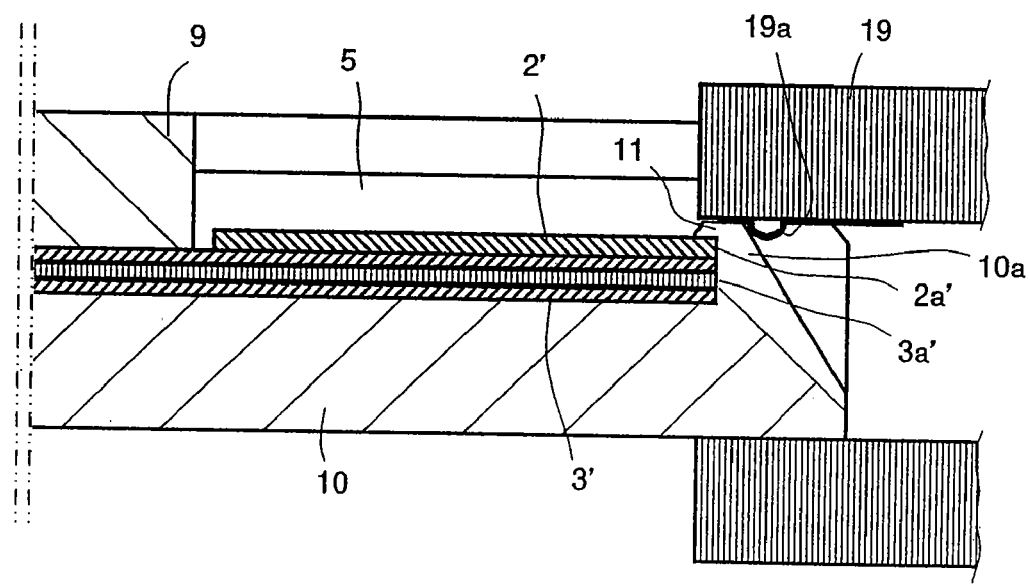
FIG. 4 is an enlarged cross-sectional view used for explanation of an unnecessary resin wall formed on a module electronic device obtained as a resin-molding.
Figure 5:
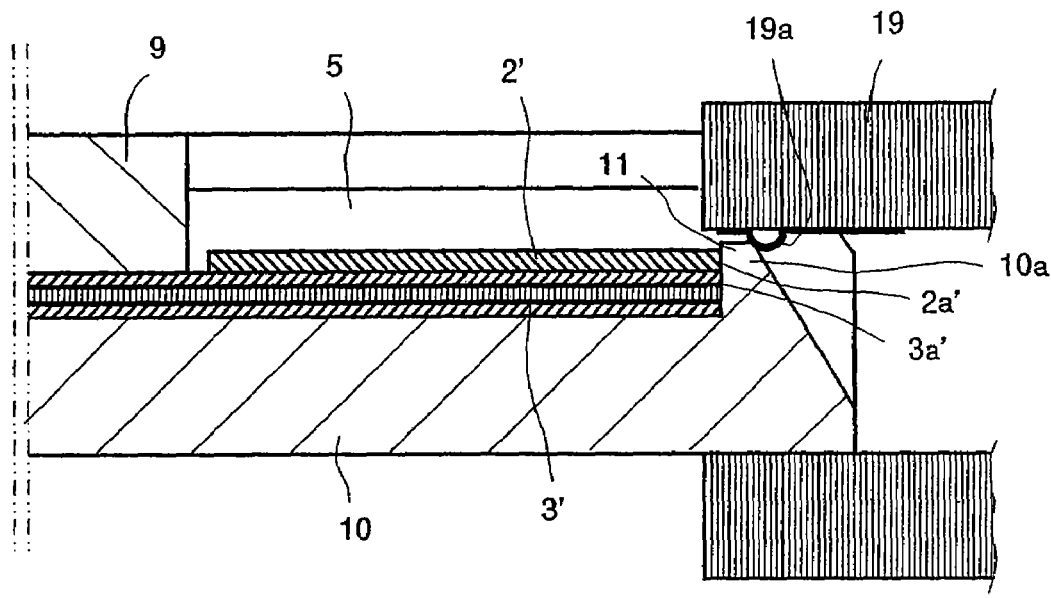
FIG. 5 is an enlarged cross-sectional view used for explanation of an unnecessary resin wall formed on a module electronic device obtained as a resin-molding.
Figure 6:
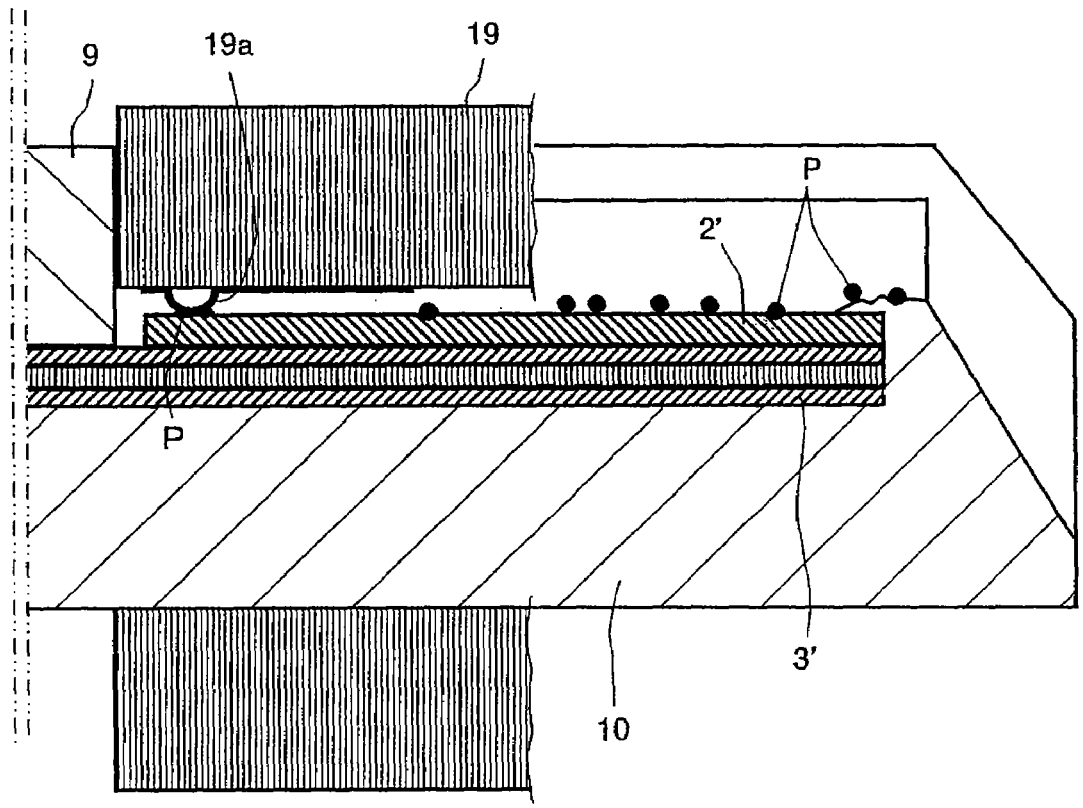
FIG. 6 is an enlarged cross-sectional view used for explanation of disadvantages brought about by an unnecessary resin wall formed on a module electronic device obtained as a resin-molding.

The module electronic device 20 shown in FIG. 7 has an upper part 21, a lower part 22 and a base board 23 shaped into rectangle and put between the upper and lower parts 21 and 22. Plural terminals 24 and plural isolating ribs 25 are fixed to be arranged on the base board 23. Each of the terminals 24 is put between a couple of ribs 25 adjacent each other though it is not shown in FIG. 7. The plural ribs 25, the upper part 21 and the lower part 22 constitute a resin-molded portion formed in a body and the upper and lower parts 21 and 22 cover the base board 23 with the terminals 24 on the base board 23 exposed to the outside of the upper part 21. Several circuit elements are mounted on the base board 23 to be buried in the upper and lower parts 21 and 22 in the similar manner as those in the module electronic device 1 shown in FIG. 1 though it is not shown in FIG. 7.

Figure 8:
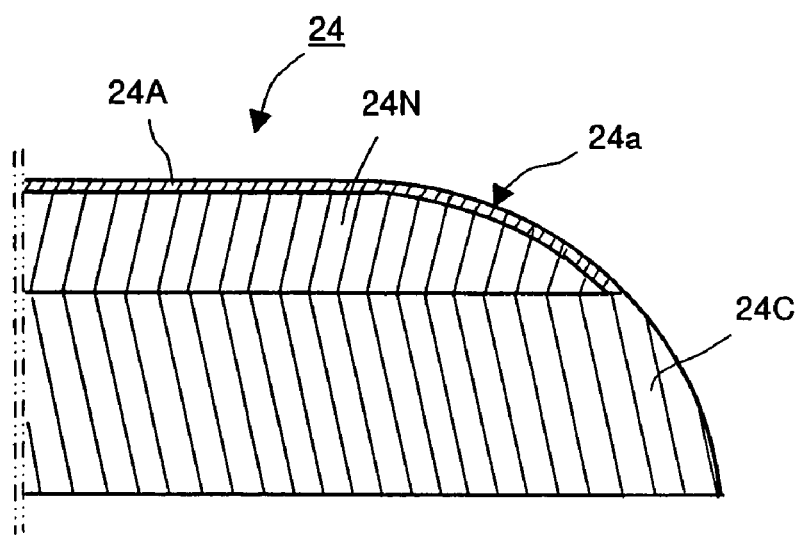
FIG. 8 is a partial enlarged cross-sectional view showing a terminal provided on the module electronic device shown in FIG. 7.

Each of the terminals 24 has its curved outer end portion 24a, as shown in FIG. 8. The curved outer end portion 24a of the terminal 24 is constituted with a copper thin layer 24C of about 10 to 20 μm in thickness, a nickel thin layer 24N of about 5 μm in thickness put on the copper thin layer 24C and a gold thin layer 24A of about 0.3 μm in thickness evaporated on the nickel thin layer 24N.

Figure 9:
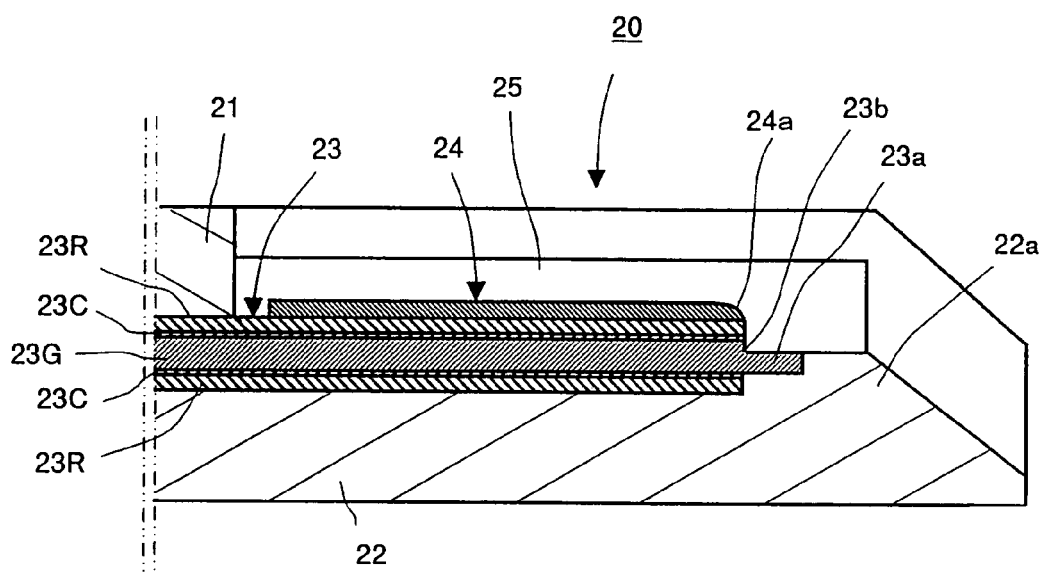
FIG. 9 is a cross-sectional view along a line B—B in FIG. 7.

Further, as shown in FIG. 9, the base board 23 has a projecting end portion 23a extending to the outside beyond the curved outer end portion 24a of each of the terminals 24 arranged on the base board 23.

The base board 23 is constituted with an epoxy resin layer 23G forming a body of the base board 23, a pair of copper thin layers 23C between which the epoxy resin layer 23G is put, and a pair of resist layers 23R between which the copper thin layers 23C and the epoxy resin layer 23G are put and which form exterior portions of the base board 23, so as to have a whole thickness of about 0.3 mm. The epoxy resin layer 23G forming the body of the base board 23 is longer by about 0.12 mm than the copper thin layers 23C and the resist layers 23R so as to extend to the outside beyond the copper thin layers 23C and the resist layers 23R to form the projecting end portion 23a. The projecting end portion 23a has a thickness smaller than that of other parts of the base board 23 and forms a step portion 23b of the base board 23.

The lower part 22 of the module electronic device 20 has a fringe portion 22a surrounding the projecting end portion 23a of the base board 23. The fringe portion 22a of the lower part 22 has an upper surface successive to an upper surface of the projecting end portion 23a of the base board 23 and is not in contact with the curved outer end portion 24a of each of the terminals 24 arranged on the base board 23. The module electronic device 20 provided with the base board 23 having the projecting end portion 23a as mentioned above is obtained by means of resin-molding process carried out in a molding apparatus.

Figure 10:
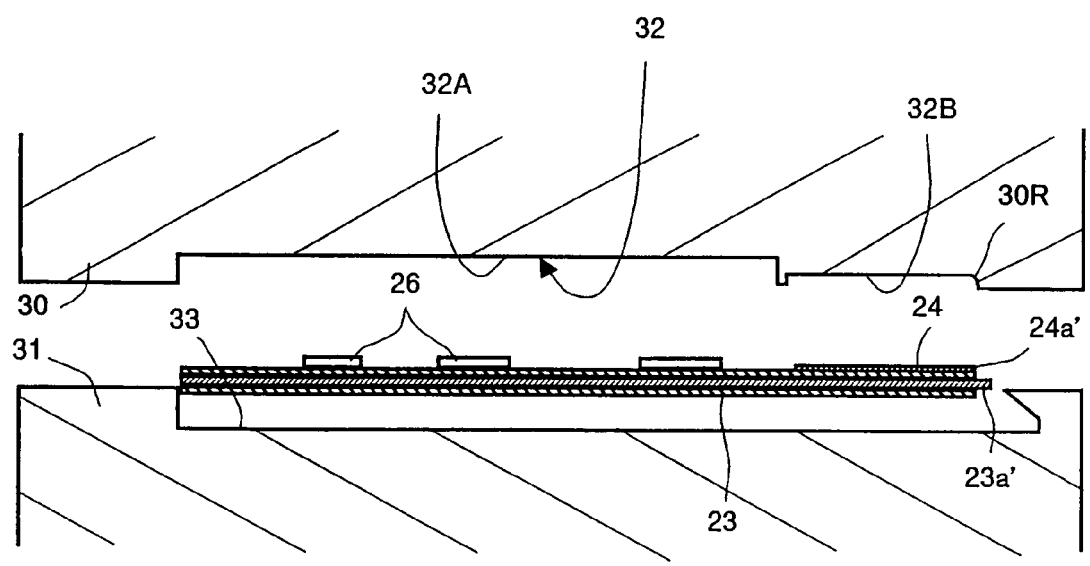
FIG. 10 is a cross-sectional view used for explanation of essential portions of an example of an apparatus for molding module electronic devices according to the invention claimed in any of claims 4 to 7 of the present application in which an example of a method for molding module electronic devices according to the invention claimed in any of claims 1 to 3 of the present application is carried out.

FIG. 10 shows an embodiment of apparatus for molding module electronic devices according to the invention claimed in any of claims 4 to 7 of the present application in which an example of a method for molding module electronic devices according to the invention claimed in any of claims 1 to 3 of the present application is carried out. The module electronic device 20 shown in FIG. 7 is obtained by means of the resin-molding process carried out in the apparatus for molding shown in FIG. 10.

The embodiment shown in FIG. 10 is provided with upper and lower molds 30 and 31 which are caused selectively to be separated from each other and to be in contact with each other. Molding space forming portions 32 and 33 are provided on the upper and lower molds 30 and 31, respectively. When the upper and lower molds 30 and 31 are caused to be in contact with each other, the molding space forming portions 32 and 33 join together to form a molding space therein. The base board 23 is put in the molding space as a molding raw material.

When the base board 23 is subjected to the resin molding process as the molding raw material, first the base board 23 is put to be supported by, for example, plural pins (not shown in the figures) between the upper and lower molds 30 and 31 which are separated from each other so as to be positioned in the molding space forming portion 33 formed on the lower mold 31. Then, the upper and lower molds 30 and 31 are shifted to be in contact with each other to form the molding space between the molding space forming portions 32 and 33 in which the base board is positioned.

Several circuit elements 26 are mounted on the base board 23 and the plural terminals 24 (only one of the terminals 24 is shown in FIG. 10) are fixed on the base board 23 to be arranged in the direction of width of the base board 23. Each of the terminals 24 has an outer edge portion 24a'. This outer edge portion 24a' of each of the terminals 24 is deformed through the resin molding process to be the curved outer end portion 24a through the resin molding process.

Further, the base board 23 has a projecting end portion 23a' extending to the outside beyond the outer edge portion 24a' of each of the terminals 24 arranged on the base board 23. This projecting end portion 23a' of the base board 23 is deformed through the resin molding process to be the projecting end portion 23a extending to the outside beyond the curved outer end portion 24a of each of the terminals 24 arranged on the base board 23.

The molding space forming portion 32 provided on the upper mold 30 includes a first part 32A having its shape corresponding to the exterior of the upper part 21 of the module electronic device 20 shown in FIG. 7 and a second part 32B having its shape corresponding to the exteriors of the plural terminals 24, plural ribs 25 and upper surface portion of the base board 23 shown in FIG. 7. The second part 32B of the molding space forming portion 32 provided on the upper mold 30 is provided with a curved portion 30R at a position corresponding to the outer edge portion 24a' of each of the terminals 24 arranged on the base board 23. The molding space forming portion 33 provided on the lower mold 31 has its shape corresponding to the exterior of the lower part of the module electronic device 20 shown in FIG. 7.

When the curved portion 30R is formed on the second part 32B of the molding space forming portion 32 provided on the upper mold 30, the position of the curved portion 30R is so determined in consideration of a predetermined dimensional tolerance of each of the base board and the upper mold 30 that any gap is not formed between the curved portion 30R and the outer edge portion 24a' of each of the terminals 24 arranged on the base board 23 which is positioned in the molding space forming portion 33 provided on the lower mold 31 when the upper and lower molds 30 and 31 are caused to be in contact with each other. Accordingly, plural curved portions 30R of the same number as the terminals 24 arranged on the base board 23 are formed on the second part 32B of the molding space forming portion 32 provided on the upper mold 30 and each of the curved portions 30R is positioned, for example, to be slightly inner than the corresponding outer edge portion 24a' of each of the terminals 24 arranged on the base board 23 which is positioned in the molding space forming portion 33 provided on the lower mold 31.

The projecting end portion 23a' of the base board 23 positioned in the molding space forming portion 33 provided on the lower mold 31 is positioned to extend to the outside of the molding space beyond the curved portions 30R formed on the molding space forming portion 32 provided on the upper mold 30.

Figure 11:
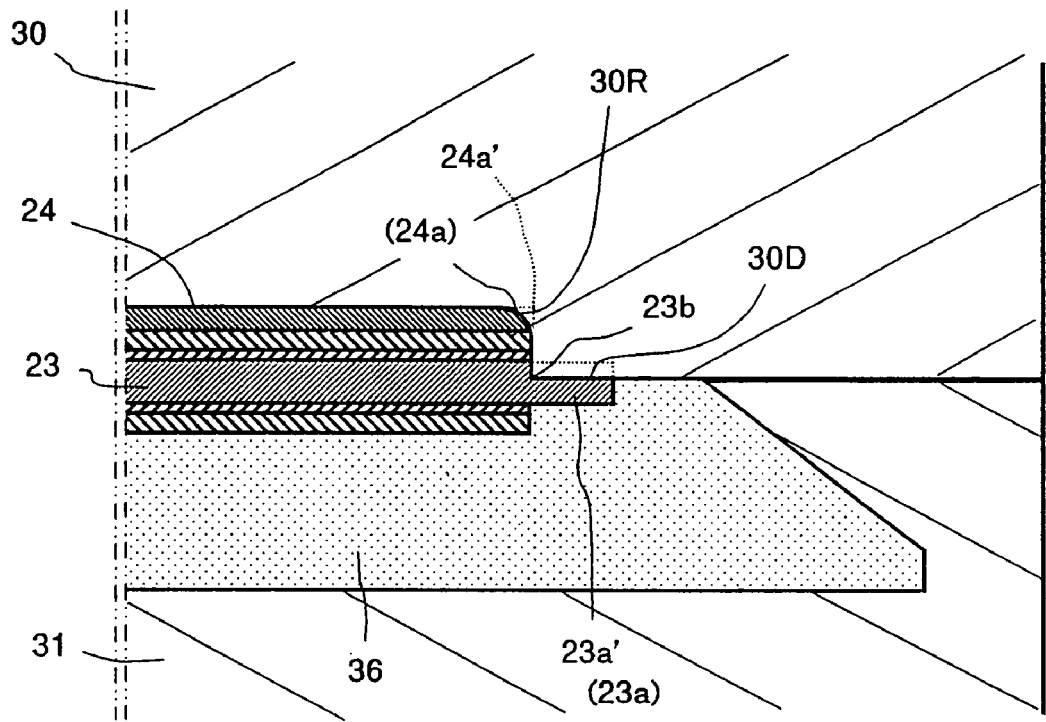
FIG. 11 is a partial enlarged cross-sectional view showing the essential portions of the apparatus for molding shown in FIG. 10.

Under the condition in which the base board 23 is put to be supported by, for example, the plural pins between the upper and lower molds 30 and 31 which are separated from each other so as to be positioned in the molding space forming portions 33 formed on the lower mold 31, as shown in FIG. 10, a mold driving mechanism (not shown in the figures) operates, for example, to move the upper mold 30 toward the lower mold 31 so that the upper and lower molds 30 and 31 are shifted to be in contact with each other, as shown in FIG. 11.

On that occasion, the upper mold 30 is operative to cause each of the curved portions 30R formed on the molding space forming portion 32 provided on the upper mold 30 to come into contact with the outer edge portion 24a' of each of the terminals 24 arranged on the base board 23 and also to cause a portion 30D at the outside of the curved portion 30R of the molding space forming portion 32 to come to contact with the projecting end portion 23a' of the base board 23, and then, to press down the outer edge portion 24a' of each of the terminals 24 and the projecting end portion 23a' of the base board 23. Therefore, the outer edge portion 24a' of each of the terminals 24 arranged on the base board 23 is subjected to press-deformation processing by the corresponding curved portion 30R formed on the molding space forming portion 32 provided on the upper mold 30 and deformed thereby to be the curved outer end portion 24a having its curved exterior corresponding to the curved portion 30R, and the projecting end portion 23a' of the base board 23 is also subjected to press-deformation processing by the portion 30D at the outside of the curved portion 30R of the molding space forming portion 32 provided on the upper mold 30 and deformed thereby to be the projecting end portion 23a forming the step portion 23b on the base board 23.

With the press-deformation processing by the curved portion 30R of the upper mold 30 by which the curved outer end portion 24a of each of the terminals 24 arranged on the base board 23 is formed and the press-deformation processing by the portion 30D of the upper mold 30 by which the projecting end portion 23a of the base board 23 is formed, any gap is not formed between the curved outer end portion 24a of each of the terminals 24 and the curved portion 30R of the upper mold 30 or between the projecting end portion 23a of the base board 23 and the portion 30D of the upper mold 30 even if there is a positional difference between the upper mold 30 and the base board 23 within a predetermined dimensional tolerance for each of the base board 23 and the upper mold 30.

The second part 32B of the molding space forming portion 32 provided on the upper mold 30 covers each of the terminals 24 arranged on the base board 23 to be in contact with the same and the molding space in which the base board 23 is positioned is formed between the molding space forming portions 32 and 33 provided respectively on the upper and lower molds 30 and 31. In the base board 23 thus positioned in the molding space, each of the terminals 24 has the curved outer end portion 24a and the projecting end portion 23a is shaped to be flat as a result of the press-deformation processing.

Then, as shown in FIG. 11, dissolved resin 36 is injected with high pressure, such as 100 kg/cm$^2$, for example, into the molding space in which the base board 23 having the terminals 24 with which the second part 32B of the molding space forming portion 32 provided on the upper mold 30 is in tight contact is positioned from a resin injecting portion (not shown) provided to be connected with the upper mold 30 or the lower mold 31 so that the molding space is filled with the dissolved resin 36. The dissolved resin 36 injected into the molding space covers the base board 23 except its portion on which the terminals 24 are arranged but is surely prevented from coming into the curved outer end portion 24a of each of the terminals 24 by the portion 30D of the upper mold 30 which is in tight contact with the projecting end portion 23a of the base board 23 and the curved portion 30R of the upper mold 30 which is in tight contact with the curved outer end portion 24a of each of the terminals 24, so that any unnecessary resin wall is not formed on or in close vicinity of the curved outer end portion 24a of each of the terminals 24 when the dissolved resin 36 injected into the molding space is cooled to solidify.

After the dissolved resin 36 injected into the molding space has been cooled to solidify, the mold driving mechanism operates, for example, to remove the upper mold 30 from the lower mold 31 so that the upper and lower molds 30 and 31 are shifted to be separated from each other.

Thereby, a resin-molding which is provided with the base board 23 having the plural terminals 24 arranged thereon with their respective curved outer end portions 24a and the projecting end portion 23a deformed to be flat for forming the step portion 23b on the base board 23, is obtained on the lower mold 31 as the shown in FIG. 7.

Figure 12:
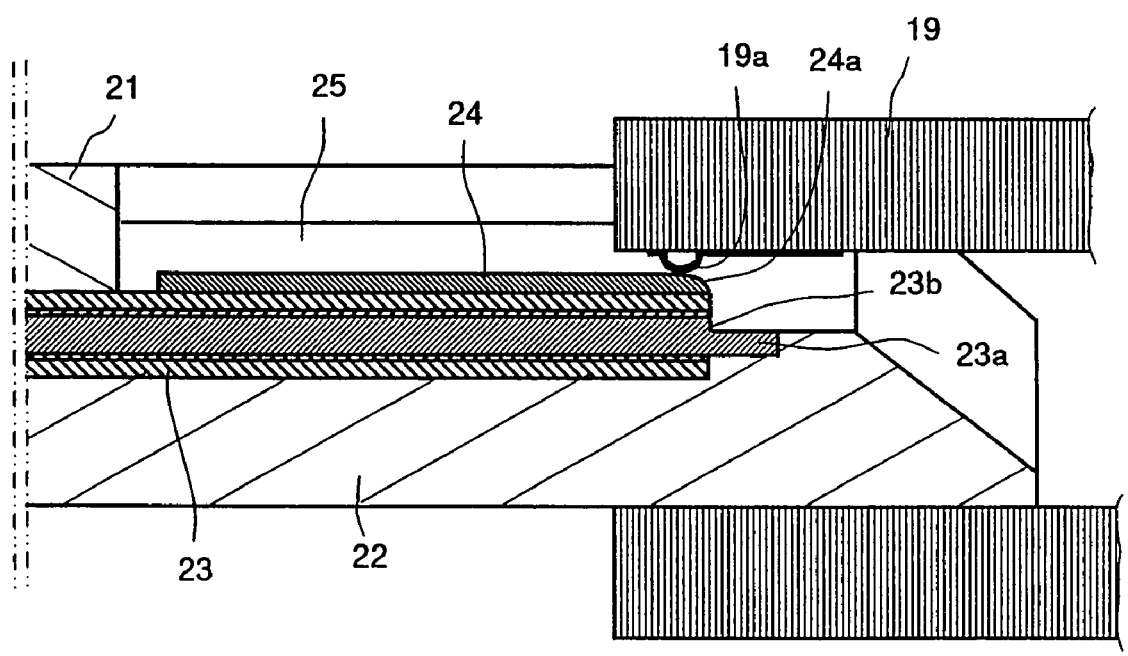
FIG. 12 is an enlarged cross-sectional view used for explanation of essential portions of the module electronic device shown in FIG. 7.

Since each of the terminals 24 has the curved outer end portion 24a without any unnecessary resin wall in the module electronic device 20 thus obtained, when the module electronic device 20 is coupled with or removed from the connector 19 provided on the electronic apparatus, as shown in FIG. 12, each of the terminals 24 can slide smoothly on the contact 19a to be in electrical contact with the same without injuring the layer of surface treatment provided on each of the contact 19a and terminal 24 so that the module electronic device 20 is correctly coupled with the electronic apparatus.

Although the upper mold 30 is provided with the curved portion 30R and therefore the resin-molding which is provided with the plural terminals 24 with their respective curved outer end portions 24a is obtained on the lower mold 31 in the above described embodiment, it is also possible for the apparatus for molding a module electronic device according to the invention claimed in any of claims 4 to 7 of the present application in which the method for molding a module electronic device according to the invention claimed in any of claims 1 to 3 of the present application is carried out, to have an upper mold which is provided with a slant portion, in place of the curved portion, facing a lower mold so that a resin-molding which is provided with plural terminals with their respective slant outer end portions is obtained on the lower mold.

APPLICABILITY FOR INDUSTRIAL USE

As apparent from the above description, in the method according to the invention claimed in any of claims 1 to 3 of the present application or the apparatus according to the invention claimed in any of claims 4 to 7 of the present application, when the upper and lower molds come into contact with each other to form the molding space in which the base board is positioned as the molding raw material, the outer edge portion of each of the plural terminals arranged on the base board is subjected to the press-deformation processing by the curved portion or the slant portion provided on the upper mold to be shaped into the deformed outer end portion and the curved portion or the slant portion provided on the upper mold comes into tight contact with the deformed outer end portion of each of the plural terminals arranged on the base board. Therefore, any gap into which the dissolved resin injected into the molding space comes to form the unnecessary resin wall on or in close vicinity of the terminals, is not formed between the upper mold and the deformed outer end portion of each of the terminals arranged on the base board.

Consequently, in the module electronic device obtained with the method according to the invention claimed in any of claims 1 to 3 of the present application or the apparatus according to the invention claimed in any of claims 4 to 7 of the present application, each of the plural terminals arranged on the base board to expose to the outside has its deformed outer end portion in the form of, for example, the curved outer end portion or the slant outer end portion formed by the press-deformation processing by the upper mold without any unnecessary resin wall.

Further, the module electronic device according to the invention claimed in claim 8 or claim 9 of the present application is obtained with the apparatus according to the invention claimed in any of claims 4 to 7 of the present application in which the method according to the invention claimed in any of claims 1 to 3 of the present application is carried out and therefore, in the module electronic device according to the invention claimed in claim 8 or claim 9 of the present application, each of the plural terminals arranged on the base board to expose to the outside has its deformed outer end portion in the form of, for example, the curved outer end portion or the slant outer end portion formed by the press-deformation processing by the upper mold without any unnecessary resin wall.

The invention claimed is:

1. A module electronic device comprising:

a base board on which a circuit element is mounted, and on which a plurality of terminals and a plurality of isolating ribs are arranged, and a resin-molded portion which covers the base board with the plurality of terminals on the base board exposed to the outside on the mounting side of the circuit element, wherein, each one of the plurality of terminals on the base board has a curved outer end portion or a slanted outer end portion, each one of the plurality of terminals is arranged between a couple of adjacent ribs.

2. A module electronic device according to claim 1, wherein the base board has a projecting end portion extending to the outside beyond an outer end portion of each one of the plurality of terminals on the base board.

* * * * *

UNITED STATES PATENT AND TRADEMARK OFFICE
CERTIFICATE OF CORRECTION

PATENT NO.       : 7,166,909 B2                              Page 1 of 1
APPLICATION NO.  : 11/031388
DATED            : January 23, 2007
INVENTOR(S)      : Shoji Morinaga et al.

It is certified that error appears in the above-identified patent and that said Letters Patent is hereby corrected as shown below:

Title page item add --(30) Foreign Application Priority Data - August 22, 2001 (JP) 2001-251936-- and

-- (62) Related U.S. Application Data - Division of Application No. 10/381,993, filed on July 7, 2003, now Pat. No. 6,940.159, which is a 371 of PCT/JP02/08336, filed on August 19, 2002 --

Signed and Sealed this

Seventeenth Day of April, 2007

JON W. DUDAS
*Director of the United States Patent and Trademark Office*